(12) United States Patent
Gong (10) Patent No.: US 7,728,681 B2
(45) Date of Patent: Jun. 1, 2010

(54) TEMPERATURE AND PROCESS INDEPENDENT VOLTAGE CONTROLLED OSCILLATOR CIRCUIT

(75) Inventor: Xiaowu Gong, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 29 days.

(21) Appl. No.: 12/122,433

(22) Filed: May 16, 2008

(65) Prior Publication Data

US 2009/0284321 A1 Nov. 19, 2009

(51) Int. Cl.
*H03K 3/26* (2006.01)
(52) U.S. Cl. .............. 331/111; 331/16; 331/108 C; 331/175; 331/176; 331/143; 331/177 R
(58) Field of Classification Search .......... 331/16, 331/108 C, 111, 175, 176, 143, 177 R
See application file for complete search history.

(56) References Cited

U.S. PATENT DOCUMENTS

| 5,852,387 | A | * | 12/1998 | Brakus et al. | ............. | 331/111 |
| 5,870,000 | A | * | 2/1999 | Matsuda et al. | ............. | 331/34 |
| 6,356,161 | B1 | * | 3/2002 | Nolan et al. | ............. | 331/176 |
| 2005/0105595 | A1 | * | 5/2005 | Martin et al. | ............. | 375/140 |
| 2006/0093017 | A1 | * | 5/2006 | Gong et al. | ............. | 375/134 |

OTHER PUBLICATIONS

"High Performance Resonant Mode Controller," Semiconductor Components Industries, LLC, Publication Order No. NCP1395/D, Mar. 2006, pp. 1-27.
"High-voltage resonant controller," STMicroelectronics, Publication Order No. L6599, Jul. 2006, pp. 1-36.
Wiegerink, "A CMOS Four-Quadrant Analog Current Multiplier," Circuits and Systems, 1991, IEEE International Sympoisum, vol. 4, pp. 2244-2247.

* cited by examiner

*Primary Examiner*—Arnold Kinkead
*Assistant Examiner*—Richard Tan
(74) *Attorney, Agent, or Firm*—Lee & Hayes, PLLC (57) ABSTRACT

Techniques for voltage controlled oscillator (VCO) circuits that are independent of temperature and process variations are described herein.

17 Claims, 8 Drawing Sheets

TEMPERATURE AND PROCESS INDEPENDENT VOLTAGE CONTROLLED OSCILLATOR CIRCUIT

BACKGROUND

A variety of electronic components utilize voltage controlled oscillator (VCO) circuits. A VCO circuit provides a frequency output that is proportional to an applied voltage. Providing clock signals, producing accurate waveforms, and providing feedback signals are among the many possible uses of VCO circuits. VCO circuits are typically used, for example, in computers, computer peripherals, counters, timers, calculators, oscilloscopes, and wireless electronic equipment, including cellular telephones and other communication devices.

One example of a device that may use a VCO circuit is a Switching-Mode Power Supply (SMPS). An SMPS enables an electrical device to operate from a variety of different power supplies, and may be included in electronic components ranging from computers, automotive components, aircraft systems, cellular telephones and other types of communication devices and systems. Modern SMPS typically use resonant switching techniques to reduce switching losses and allow high-frequency operation, thus increasing power density. One important topology for such SMPS applications is known as the LLC resonant half bridge which senses an output voltage, generates a feedback signal, and then uses this feedback signal to control an operating switching frequency of the SMPS. Although desirable results have been achieved using conventional topologies, there is room for improvement.

BRIEF DESCRIPTION OF THE DRAWINGS

The detailed description is described with reference to the accompanying figures. The use of the same reference numbers in different instances in the description and the figures may indicate similar or identical items.

DETAILED DESCRIPTION

Disclosed herein are improved systems and methods for voltage controlled oscillator (VCO) circuits. Implementations in accordance with the present disclosure may convert a feedback voltage and a reference voltage into a current signal, and by using at least one current multiplier, may ensure that the feedback voltage exhibits a full working range. Such implementations may advantageously exhibit temperature and process independence, may provide an ability to detect overloads, and may be configured to operate using simplified hardware requirements in comparison with conventional systems and methods.

Systems and methods in accordance with the present disclosure may be implemented in a number of suitable ways. An exemplary environment and an exemplary system for implementing such techniques are described in the following section.

Exemplary Environment and System

Figure 1:
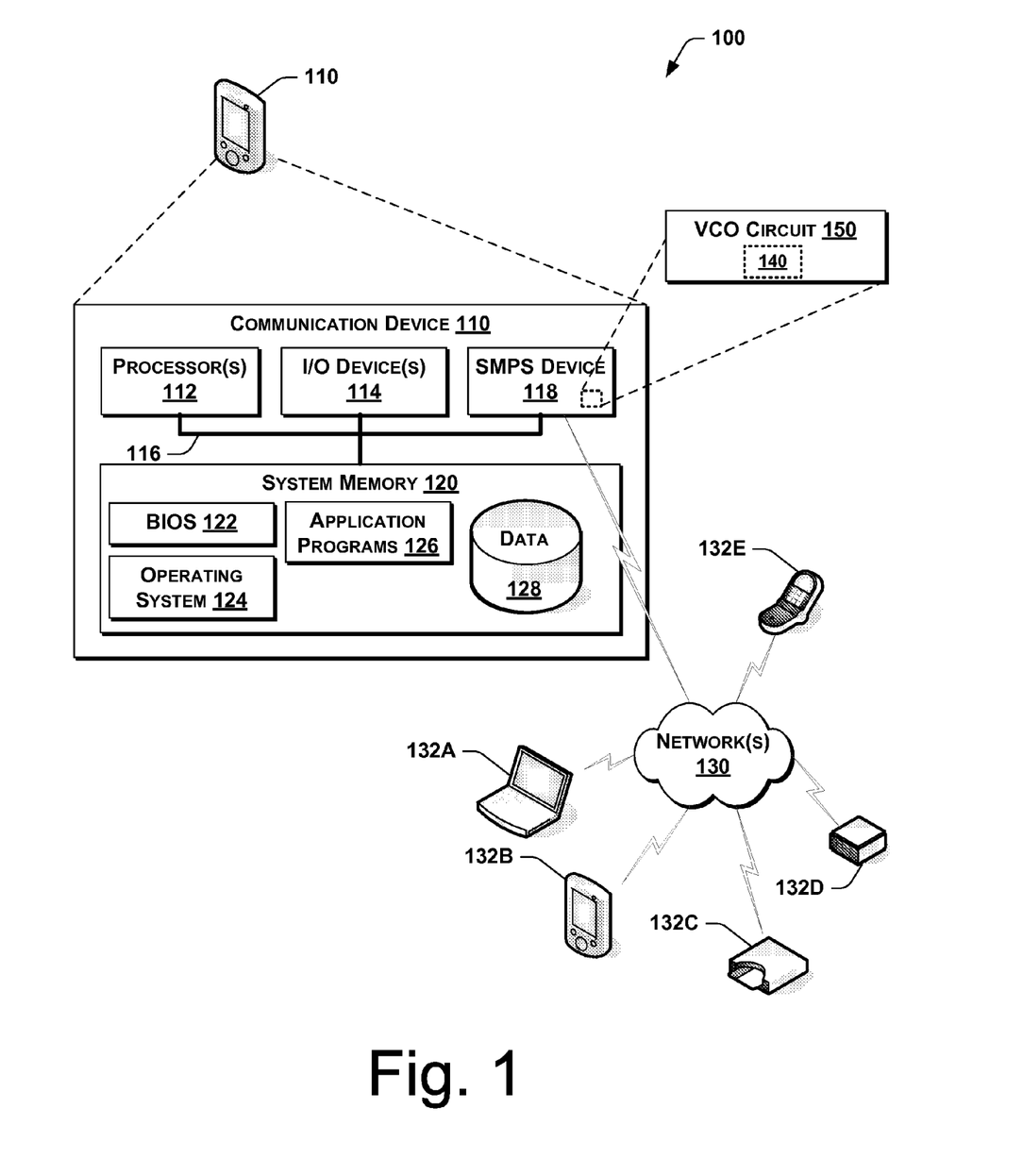
FIG. 1 is an exemplary environment in which techniques in accordance with the present disclosure may be implemented.

FIG. 1 illustrates an exemplary environment 100 in which techniques in accordance with the present disclosure may be implemented. In this implementation, the environment 100 includes a communication device 110 having a Switching-Mode Power Supply (SMPS) device 118 that includes a voltage controlled oscillator (VCO) circuit 150 configured in accordance with the teachings of the present disclosure. The VCO circuit 150 includes an oscillator 140 that provides a desired oscillating signal used by the SMPS device 118. The communication device 110 operatively communicates via one or more networks 130 with a plurality of other devices 132. Additionally or alternatively, the communication device 110 may bypass the networks 130 and communicate directly with one or more of the other devices 132. Detailed descriptions of various aspects of the SMPS device 118 and the VCO circuit 150 are provided in the following sections with reference to FIGS. 2 through 4.

In the representative environment 100, the communication device 110 may be a hand-held device, such as a cellular telephone, a personal data assistant (PDA), a global positioning system (GPS) unit, or other similar hand-held device. The other devices 132 in the environment 100 may include, for example, a computer 132A, another hand-held device 132B, a compact disc (CD) or digital video disc (DVD) player 132C, a signal processor 132D (e.g., oscilloscope, radio, navigational unit, television, electronic device, component, etc.), and another cell phone 132E. Of course, the devices 110, 132 may comprise any other suitable devices, and it is understood that any of the other devices 132 of the environment 100 may be equipped with SMPS devices 118 and VCO circuits 150 in accordance with further implementations of the present disclosure.

In the implementation shown in FIG. 1, the communication device 110 includes one or more processors 112 and one or more input/output (I/O) devices 114 (e.g., transceivers, transmitters, receivers, etc.) coupled to a system memory 120 by a bus 116. Power is provided to the components of the communication device 110 via the SMPS device 118. In this implementation, the VCO circuit 150 is included as a component of the SMPS device 118 of the communication device 110. In alternative implementations, however, the VCO circuit 150 may be integrated with any other suitable portion of the device 110 (e.g. processors 112, I/O devices 114, etc.), or may be a separate, individual component of the device 110.

The system bus 116 of the communication device 110 represents any of the several types of bus structures, including a memory bus or memory controller, a peripheral bus, an accelerated graphics port, and a processor or local bus using any of a variety of bus architectures. The I/O component 114 may be configured to operatively communicate with one or more external networks 130, such as a cellular telephone network, a satellite network, an information network (e.g., Internet, intranet, cellular network, cable network, fiber optic network, LAN, WAN, etc.), an infrared or radio wave communication network, or any other suitable network.

The system memory 120 may include computer-readable media configured to store data and/or program modules for implementing the techniques disclosed herein that are immediately accessible to and/or presently operated on by the processor 112. For example, the system memory 120 may also store a basic input/output system (BIOS) 122, an operating system 124, one or more application programs 126, and program data 128 that can be accessed by the processor 112 for performing various tasks desired by a user of the communication device 110.

Moreover, the computer-readable media included in the system memory 120 can be any available media that can be accessed by the device 110, including computer storage media and communication media. Computer storage media may include both volatile and nonvolatile, removable and non-removable media implemented in any method or technology for storage of information such as computer-readable instructions, data structures, program modules, or other data. Computer storage media includes, but is not limited to, and random access memory (RAM), read only memory (ROM), electrically erasable programmable ROM (EEPROM), flash memory or other memory technology, compact disk ROM (CD-ROM), digital versatile disks (DVD) or other optical disk storage, magnetic cassettes, magnetic tape, magnetic disk storage or other magnetic storage devices, or any other medium, including paper, punch cards and the like, which can be used to store the desired information and which can be accessed by the communication device 110.

Similarly, communication media may include computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

Generally, program modules executed on the device 110 (FIG. 1) may include routines, programs, objects, components, data structures, etc., for performing particular tasks or implementing particular abstract data types. These program modules and the like may be executed as a native code or may be downloaded and executed such as in a virtual machine or other just-in-time compilation execution environments. Typically, the functionality of the program modules may be combined or distributed as desired in various implementations.

Although the exemplary environment 100 is shown as in FIG. 1 as a communication network, this implementation is meant to serve only as a non-limiting example of a suitable environment for use of the VCO circuit 150 in accordance with present disclosure. Similarly, the device 110 is simply one non-limiting example of a suitable device that may include VCO circuits 150 in accordance with the present disclosure.

VCO Circuit

Figure 2:
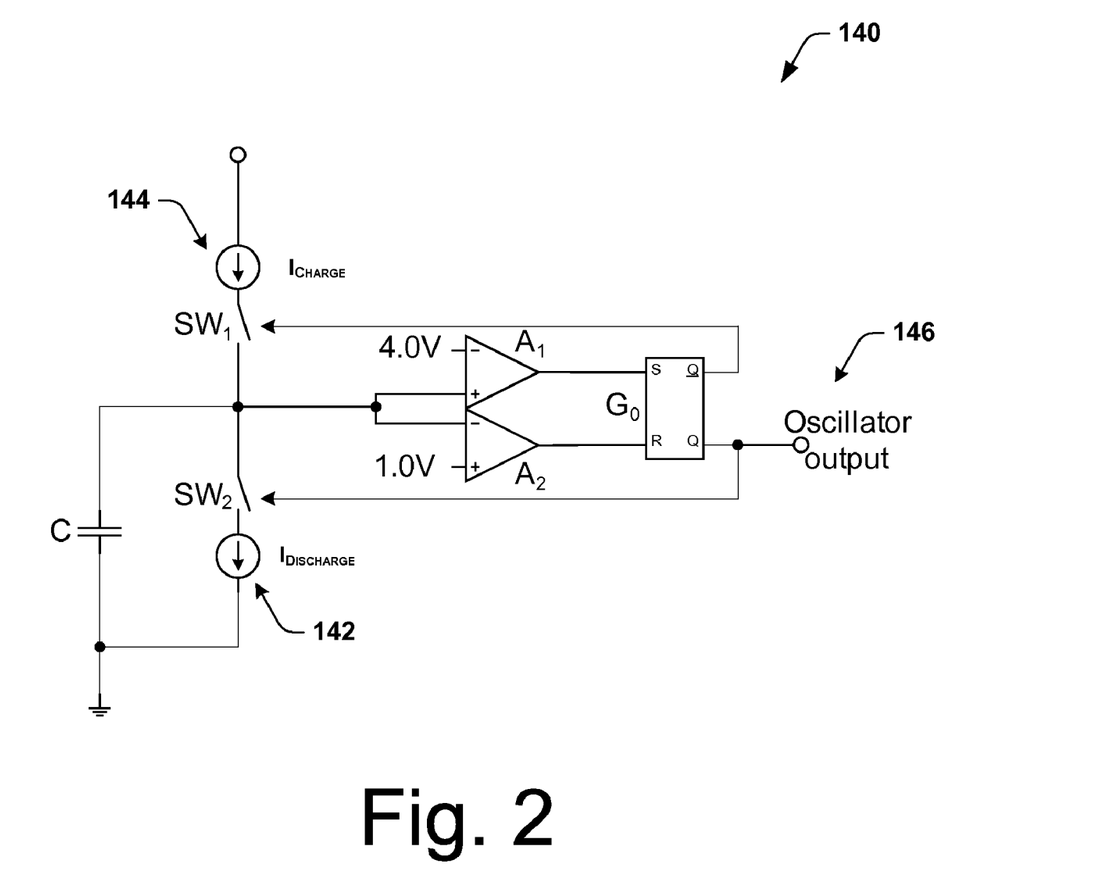
FIG. 2 is an exemplary oscillator of a voltage controlled oscillator (VCO) circuit in accordance with an implementation of the disclosure.
Figure 3A:
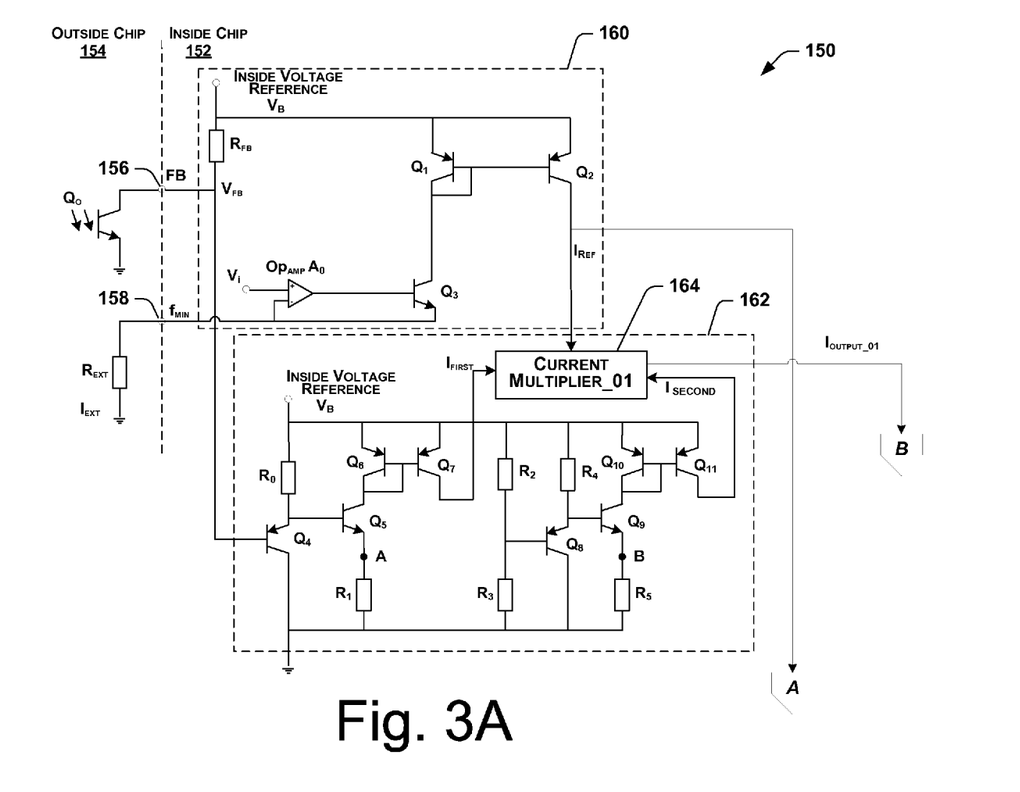
FIGS. 3A and 3B show an exemplary voltage controlled oscillator (VCO) circuit in accordance with an implementation of the disclosure.
Figure 3B:
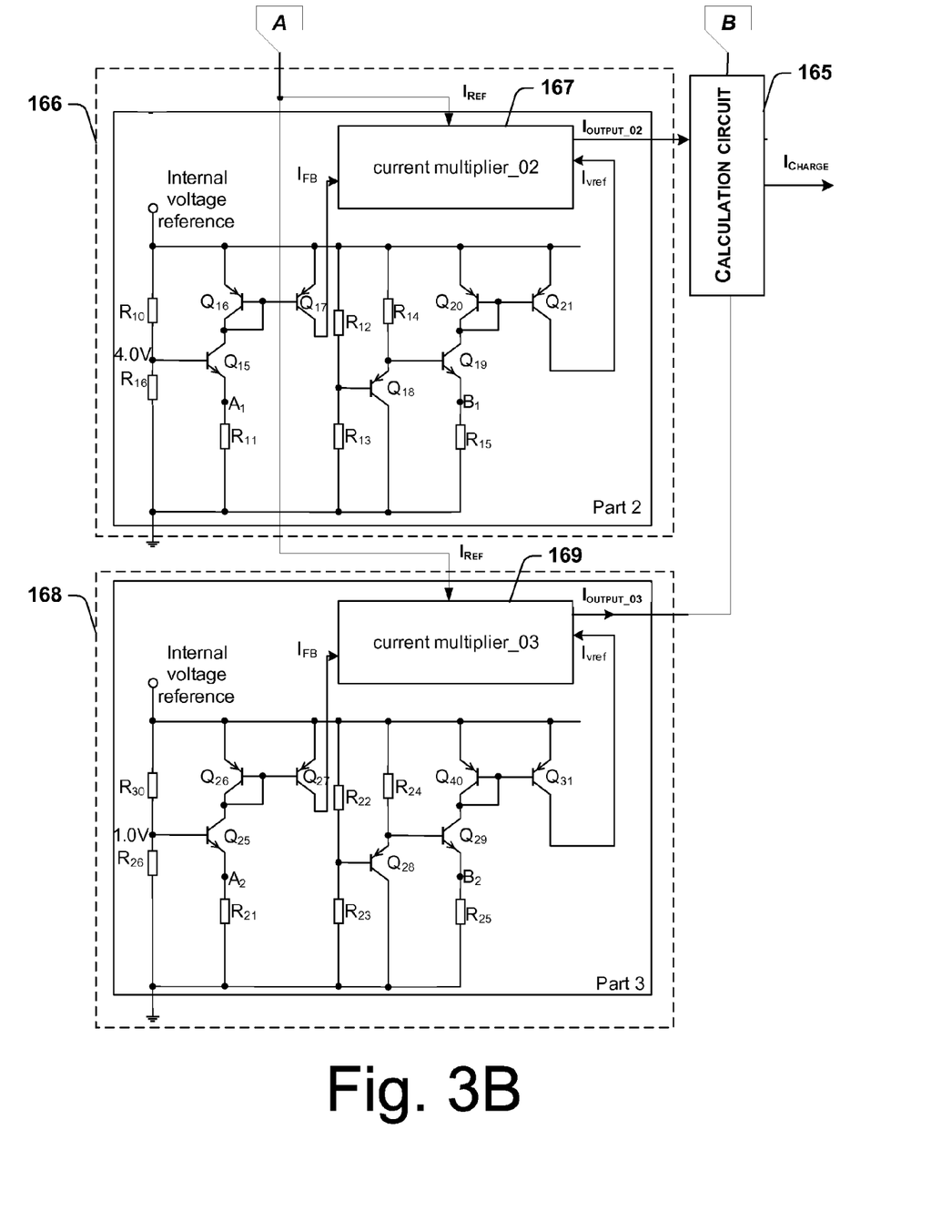

Structural and operational aspects of implementations of voltage controlled oscillator (VCO) circuits in accordance with the present disclosure will now be described. For example, FIGS. 2, 3A, and 3B show an exemplary VCO circuit 150, and exemplary oscillator 140, of the communication device 110 of FIG. 1 in accordance with an implementation of the present disclosure. More specifically, in some implementations, the VCO circuit 150 may be included within an LLC resonant half bridge which senses an output voltage, generates a feedback signal, and then uses this feedback signal to control an operating switching frequency of the SMPS device 118. The VCO circuit 150 may also provide overload protection by enabling the detection of a feedback voltage, as described more fully below.

With reference to FIG. 2, the oscillator 140 includes a capacitor C, a first current source 142 that provides a discharging current $I_{discharge}$ and a second current source 144 that provides a charging current $I_{charge}$. The capacitor C charges and discharges between two threshold voltage levels (e.g. 1.0V & 4.0V), the voltage over capacitor will trigger first and second comparators $A_1$, $A_2$ which, in turn, trigger an RS flip flop $G_0$ that provides an oscillator output 146. In the implementation of FIG. 2, the discharge current $I_{discharge}$ may remain fixed, while the charging current $I_{charge}$ may be varied to controllably adjust the oscillator frequency.

As shown in FIG. 3A, in this implementation, the VCO circuit 150 includes an inside chip portion 152 that is coupled to an outside chip portion 154 by pins 156, 158. A first (or feedback FB) pin 156 couples an opticoupler $Q_0$ of the outside chip portion 154 to the inside chip portion 152, and a second pin 158 couples an external resistor $R_{ext}$ of the outside chip portion 154 to the inside chip portion 152. The second pin 158 may be characterized by a minimum current oscillator frequency $f_{min}$ provided by the VCO circuit 150.

The opticoupler $Q_0$ receives a feedback voltage $V_{fb}$ as an input. The feedback voltage $V_{fb}$ may be used to control the charging current $I_{charge}$ provided by the VCO circuit 150 to the oscillator 140 (FIG. 2). In some implementations, when the charging current $I_{charge}$ increases, the oscillator frequency may become high, and when the charging current $I_{charge}$ decreases, the oscillator frequency will become low.

In some implementations, the VCO circuit 150 may be configured to satisfy the following operating conditions:
a) when the feedback voltage $V_{fb}$ is greater than an upper range limit (e.g. in some implementations, $V_{fb}>4.0$ V), the charging current $I_{charge}$ should have a minimum current value $I_{charge\_min}$;
b) when the feedback voltage $V_{fb}$ is less than a lower range limit (e.g. in some implementations, $V_{fb}<1.0$ V), the charging current $I_{charge}$ should have a maximum current value $I_{charge\_max}$, (e.g. in some implementations, $I_{charge\_max}=2\times I_{charge\_min}$); and
c) when the feedback voltage $V_{fb}$ is within a range established by the lower range limit and the upper range limit (e.g. in some implementations, $1.0 V \leq V_{fb} \leq 4.0 V$), the charging current $I_{charge}$ should decreases as the feedback voltage $V_{fb}$ increases. In some implementations, the relationship between the charging current $I_{charge}$ and the feedback voltage $V_{fb}$ may be linear, and may exhibit an uncertainty of a mean gain $G_m$ of within approximately +/−10% variation. Thus, in some implementations, the relationship between the charging current $I_{charge}$ and the feedback voltage $V_{fb}$ may be given by:

$$I_{charge} = \left(\left|\frac{4.0\,V - V_{FB}}{3}\right| \times 2 + 1\right) \times I_{charge\_min}. \quad (1)$$

Figure 4:
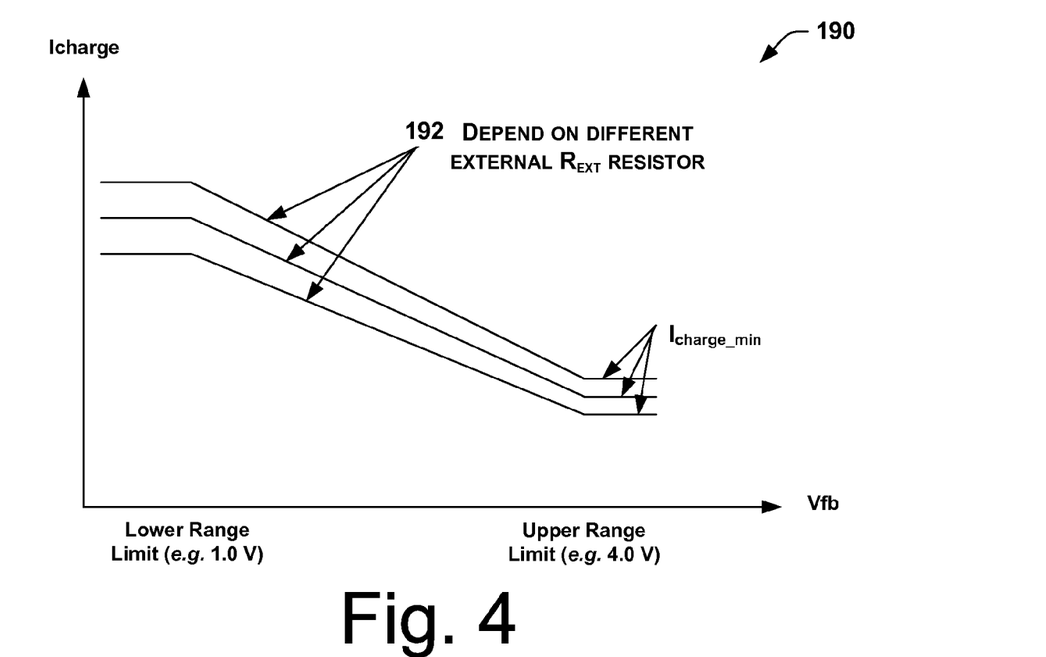
FIG. 4 is a graph showing a desired waveform of a charging current $I_{charge}$ versus a feedback voltage $V_{fb}$ for a plurality of external resistor values $R_{ext}$ for the VCO circuit of FIGS. 3A and 3B.

With continued reference to FIGS. 3A and 3B, it will be appreciated that using different values for the external resistor $R_{ext}$ results in different waveforms for the charging current $I_{charge}$. FIG. 4 is a graph 190 showing waveforms 192 of a charging current $I_{charge}$ versus a feedback voltage $V_{fb}$ for a plurality of external resistor values $R_{ext}$ according to the operating conditions set forth above for the VCO circuit 150 of FIGS. 3A and 3B.

More specifically, the first pin 156 may be used to provide the feedback voltage $V_{fb}$ to the optocoupler $Q_0$. The second pin 158 provides a voltage level to the external resistor $R_{ext}$ that results in an external current $I_{ext}$ through said external resistor $R_{ext}$. The external resistor $R_{ext}$ can be fashioned very accurately, and may be configured such that it does not exhibit process variation or temperature variation (e.g. $R_{ext}$ may not require a temperature coefficient). Ultimately, the feedback voltage $V_{fb}$ and the external resistor $R_{ext}$ may enable a voltage-controlled regulation of the charging current $I_{charge}$, which in turn may be used to control oscillator frequency.

The VCO circuit 150 may exhibit several advantageous characteristics. For example, the control of the mean gain $G_m$ of the oscillator 140 (FIG. 2) of the VCO circuit 150 (given by $G_m = I_{charge}/V_{fb}$) will not necessarily be fixed, as it depends on the minimum current oscillator frequency $f_{min}$ (or the external current $I_{ext}$ through the external resistor $R_{ext}$). Also, the control of the mean gain $G_m$ may be independent of internal process and temperature variation, and will ensure that the feedback voltage $V_{fb}$ will have full control range.

For example, in some implementations, if a desired working range of the feedback voltage $V_{fb}$ is from approximately 1.0 V to approximately 4.0 V, alternate VCO circuit configurations (e.g. conventional Operational Transconductance Amplifier (OTA) circuits) that provide an actual working range of the feedback voltage $V_{fb}$ that varies from this desired working range due to process and temperature variations (e.g. $1.5\,V \leq V_{fb} \leq 3.5\,V$, or $0.5\,V \leq V_{fb} \leq 4.5\,V$) may be unacceptable. As described more fully below, the VCO circuit 150 may be configured to convert the feedback voltage $V_{fb}$ and a reference voltage $V_{ref}$ into a current signal, and using a current multiplier, it is possible to make the feedback voltage $V_{fb}$ have full working range and not be dependent on process and temperature.

Referring again to FIG. 3A, a first segment 160 of the VCO circuit 150 includes transistors $Q_1$, $Q_2$, $Q_3$, a feedback resistor $R_{fb}$, and an operational amplifier $A_0$. A positive input voltage $V_i$ to the operational amplifier $A_0$ establishes a minimum voltage value (e.g. $V_i = 2.0\,V$) at the third transistor $Q_3$. The transistors $Q_1$, $Q_2$, $Q_3$ and the operational amplifier $A_0$ are configured to provide a constant voltage over different external resistor (e.g. for an OTA circuit), while the feedback resistor $R_{fb}$ and the optocoupler $Q_0$ are configured to provide the feedback voltage $V_{fb}$. The first segment 160 of the VCO circuit 150 also provides the feedback voltage $V_{fb}$ and a reference current $I_{ref}$ to a second segment 162 of the VCO circuit 150.

The second segment 162 includes transistors $Q_4$, $Q_5$, $Q_6$, $Q_7$, and resistors $R_0$, $R_1$ that are configured to provide a first source current $I_{first}$. In the configuration shown in FIG. 3A, the first source current $I_{first}$ is determined by the ratio of the feedback voltage $V_{fb}$ over the first resistance $R_1$, such that $I_{first} = (V_{fb}/R_1)$. Similarly, the second segment 162 includes transistors $Q_8$, $Q_9$, $Q_{10}$, $Q_{11}$, and resistors $R_2$, $R_3$, $R_4$, $R_5$ that are configured to provide a second source current $I_{second}$. In the configuration shown in FIG. 3A, the second source current $I_{second}$ is determined by the ratio of a reference voltage $V_B$ over the fifth resistance $R_5$, such that $I_{second} = (V_B/R_5)$, where reference voltage $V_B$ is generated by voltage divider chain $R_2$ and $R_3$, such that $$V_B = \frac{R_3}{R_2 + R_3} \times V_{ref},$$

and in some implementations, the reference voltage $V_B$ may be selected to be approximately 1.0 V.

As further shown in FIG. 3A, the second segment 162 further includes a first current multiplier 164. The first current multiplier 164 receives the first and second source currents $I_{first}$, $I_{second}$, and the reference current $I_{ref}$ from the first segment 160, and provides an output current $I_{output}$ (or first output current. In some implementations, the output current $I_{output}$ provided by the first current multiplier 164 is given by:

$$I_{output} = \frac{I_{first} \times I_{ref}}{I_{second}} \quad (2)$$
$$= \frac{\frac{V_{FB}}{R_1} \times \frac{V_{fmin}}{R_{ext}}}{\frac{1.0\,V}{R_5}}.$$

From Equation (2) it will be appreciated that the output current $I_{output}$ depends on the feedback voltage $V_{fb}$ and the external resistor $R_{ext}$. The output current $I_{output}$ will be high when the feedback voltage $V_{fb}$ is high or the value of the external resistor $R_{ext}$ is low. In addition, the output current $I_{output}$ does not depend on internal process variations or a temperature coefficient, because even though resistors $R_1$ and $R_5$ may have variations due to process or temperature (or both), these variations can be cancelled out if same type of resistors are used (e.g. n-type metal-oxide semiconductor (NMOS) resistors) for these two resistors $R_1$, $R_5$. Thus, the feedback voltage $V_{fb}$ may have a full working range, and the output current $I_{output}$ will not depend on process or temperature variations.

Figure 5:
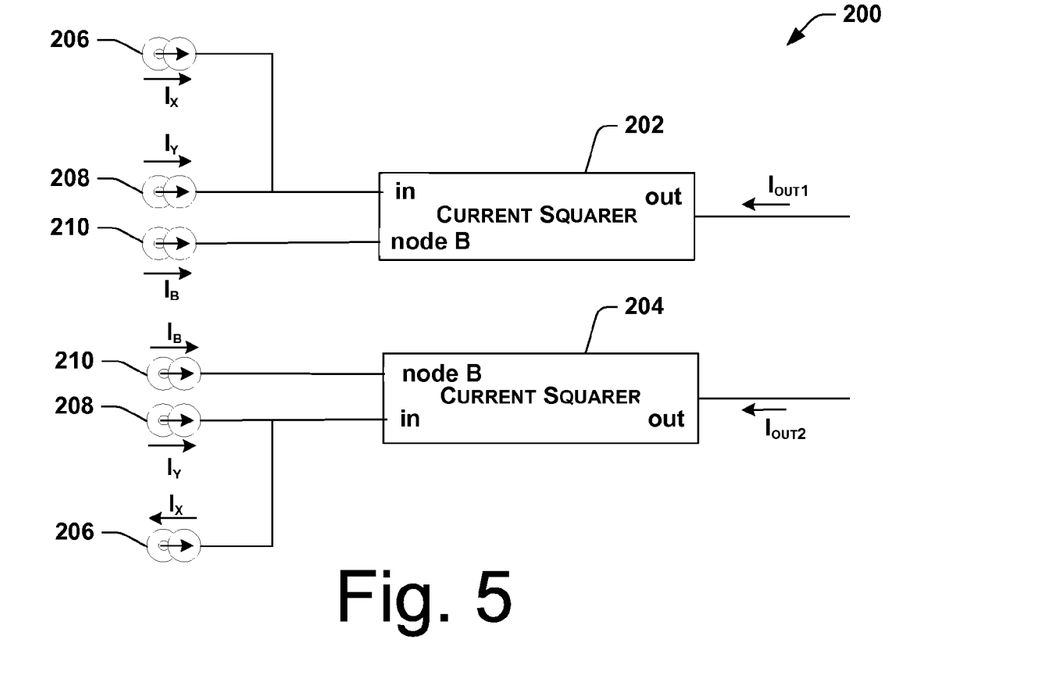
FIG. 5 is an exemplary current multiplier circuit suitable for use in the VCO circuit of FIGS. 3A and 3B in accordance with an implementation of the disclosure.

The first current multiplier 164 may be configured in a variety of suitable ways to achieve the desired result. For example, FIG. 5 is an exemplary current multiplier circuit 200 suitable for use in the first current multiplier 164 of FIG. 3A in accordance with a particular implementation of the disclosure. In this implementation, the current multiplier circuit 200 is of a type known as a four-quadrant current multiplier, as described more fully, for example, in "*A CMOS Four-Quadrant Analog Current Multiplier*" by R. J. Wiegerink, Circuits and Systems, 1991, IEEE International Symposium on 11-14 Jun., 1991, pp. 2244-2247, vol. 4, incorporated herein by reference. The current multiplier circuit 200 includes a first current squarer 202 and a second current squarer 204. Current sources 206, 208, 210 provide input currents $I_x$, $I_y$, $I_b$, to the first and second current squarers 202, 204, which in turn provide first and second intermediate output currents $I_{out1}$, $I_{out2}$, respectively. In alternate implementations, other current multiplier circuits may be used.

Figure 6:
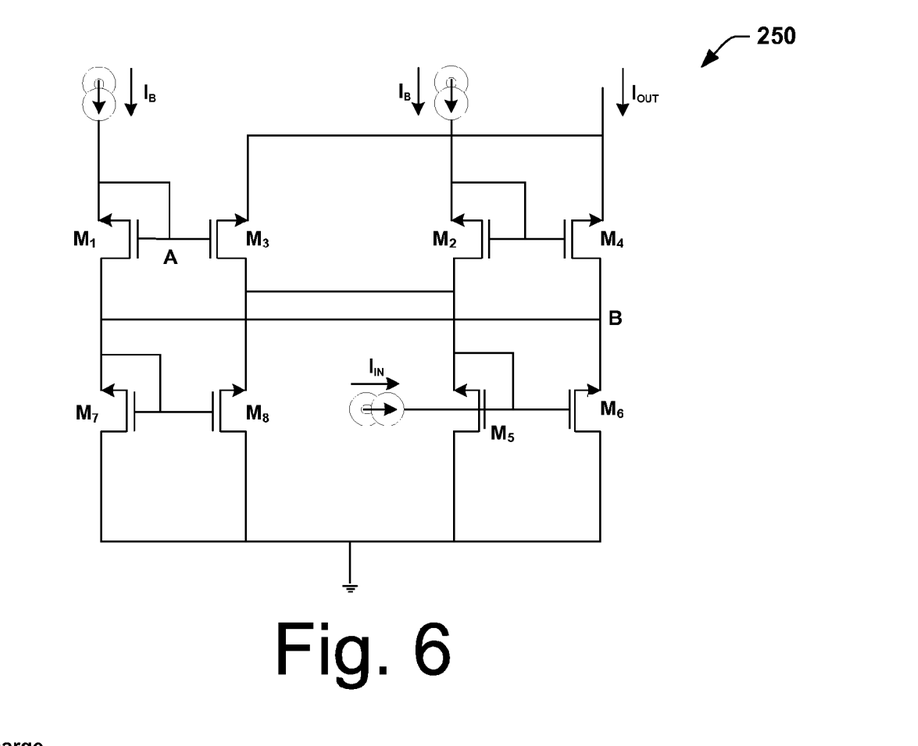
FIG. 6 is a current squaring circuit suitable for use in the current multiplier circuit of FIG. 5 in accordance with an implementation of the disclosure.

It will be appreciated that the current squarers 202, 204 of FIG. 5 may be configured in a variety of suitable ways. For example, FIG. 6 is a current squaring circuit 250 suitable for use in one or more of the current squarers 202, 204 of FIG. 5 in accordance with a particular implementation of the disclosure. The current squaring circuit 250 is one of several squaring circuits described in the above-referenced IEEE paper by Wiegerink. More specifically, in this implementation, the current squaring circuit 250 receives input currents $I_b$, $I_{in}$, and includes transistors $M_1$, $M_2$, $M_3$, $M_4$, $M_5$, $M_6$, $M_7$, $M_8$ configured as shown in FIG. 6 to provide an output current $I_{out}$. In alternate implementations, other current squaring circuits may be used.

As more fully described by Wiegerink, for the current squaring circuit 250 shown in FIG. 6, the equation for the output current is given by:

$$I_{out} = 2 \times I_B + \frac{I_m^2}{8 \times I_B} \quad (3)$$

From Equation (3), and the configuration of the current multiplier circuit 200 shown in FIG. 5, it follows that the first intermediate output current $I_{out1}$ is given by:

$$I_{out1} = 2 \times I_B + \frac{(I_y + I_x)^2}{8 \times I_B} \quad (4)$$

and the second intermediate output current $I_{out2}$ is given by:

$$I_{out2} = 2 \times I_B + \frac{(I_y - I_x)^2}{8 \times I_B}. \quad (5)$$

From Equations (4) and (5), the output current $I_{output}$ (or first output current $I_{output01}$) from the first current multiplier 164 of the VCO circuit 150 of FIG. 3A is given by:

$$I_{out} = I_{out1} - I_{out2} = \frac{I_x \times I_y}{2 \times I_B}. \quad (6)$$

As shown in FIG. 3B, the VCO circuit 150 further includes a third segment 166 having a second current multiplier 167, and a fourth segment 168 having a third current multiplier 169. The third and fourth segments 166, 168 may be implemented analogously to the second segment 162, and the second and third current multipliers 167, 169 may be implemented similar to the first current multiplier 164. Thus, the second and third current multipliers 167, 169 may provide second and third output currents Ioutput02, Ioutput03, respectively.

Figure 7:
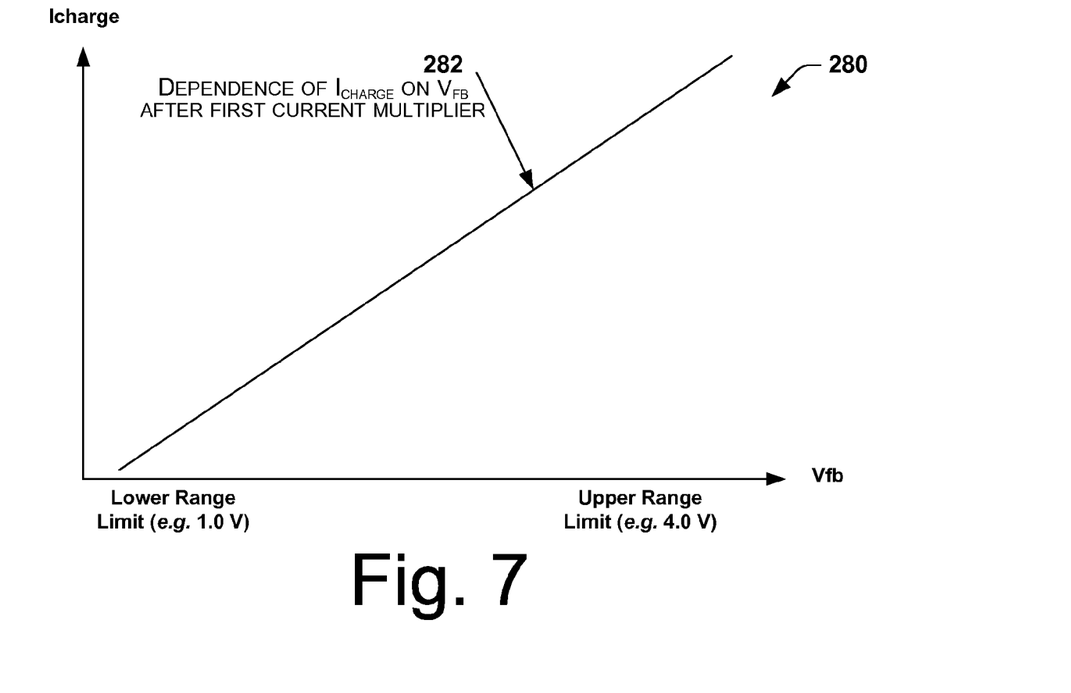
FIG. 7 is a graph of simulation results showing a relationship between $I_{charge}$ and $V_{fb}$ after a first current multiplier of the VCO circuit of FIGS. 3A and 3B.

FIG. 7 is a graph 280 of simulation results showing a relationship between the charging current $I_{charge}$ and the feedback voltage $V_{fb}$ after a first one of the current multiplier circuits 200 of FIG. 5. It is apparent that a waveform 282 of the charging current $I_{charge}$ versus feedback voltage $V_{fb}$ does not exhibit the desired characteristic shape of the desired waveforms 192 of charging current $I_{charge}$ versus feedback voltage $V_{fb}$ shown in FIG. 4. The waveform 282 does not meet the required operating conditions for several reasons, including that when the feedback voltage $V_{fb}$ is within a range established by the lower range limit and the upper range limit (e.g. in some implementations, $1.0V \leq V_{fb} \leq 4.0V$), the charging current $I_{charge}$ increases (rather than decreases) as the feedback voltage $V_{fb}$ increases. Also, when the feedback voltage $V_{fb}$ is greater than the upper range limit (e.g. $V_{fb} > 4.0 V$) or less than the lower range limit (e.g. $V_{fb} < 1.0 V$), the charging current $I_{charge}$ continues to vary, rather than remain constant as set forth above. Thus, Equation (6) by itself does not provide the desired operating characteristics of the VCO circuit 150 as described above and shown in FIG. 4.

To provide the desired waveform characteristics (FIG. 4), two additional equations may be used. First, an equation used to check the charging current $I_{charge}$ value when the feedback voltage $V_{fb}$ is set at the lower range limit (e.g. 1.0 V) is given by:

$$I_{out\_10} = \frac{\frac{1.0\,V}{R_1} \times \frac{V_{fmin}}{R_{ext}}}{\frac{1.0\,V}{R_5}}. \quad (7)$$

Similarly, an equation used to check the charging current $I_{charge}$ value when the feedback voltage $V_{fb}$ is set at the upper range limit (e.g. 4.0 V) is given by:

$$I_{out\_40} = \frac{\frac{4.0\,V}{R_1} \times \frac{V_{fmin}}{R_{ext}}}{\frac{1.0\,V}{R_5}}. \quad (8)$$

Figure 8:
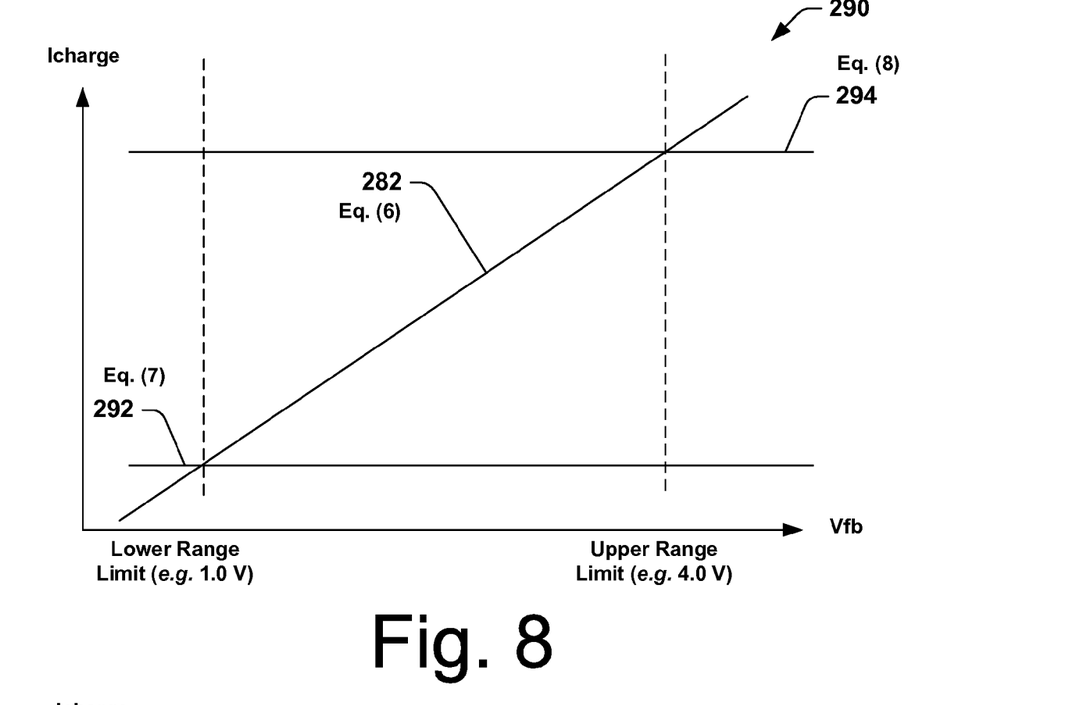
FIG. 8 is a graph of simulation results showing a relationship between $I_{charge}$ and $V_{fb}$ for three equations in accordance with another implementation of the disclosure.

FIG. 8 is a graph 290 of simulation results showing a relationship between the charging current $I_{charge}$ and the feedback voltage $V_{fb}$ for Equations (6), (7), and (8). More specifically, a first waveform 282 represents the value of the charging current $I_{charge}$ as a function of the feedback voltage $V_{fb}$ for Equation (6), a second waveform 292 represents this relationship for Equation (7), and a third waveform 294 represents this relationship for Equation (8). From FIG. 8, in some implementations, a desired waveform shape of charging current $I_{charge}$ versus feedback voltage $V_{fb}$ may be achieved by manipulating selected portions of the waveforms for Equations (6), (7), and (8).

Figure 9:
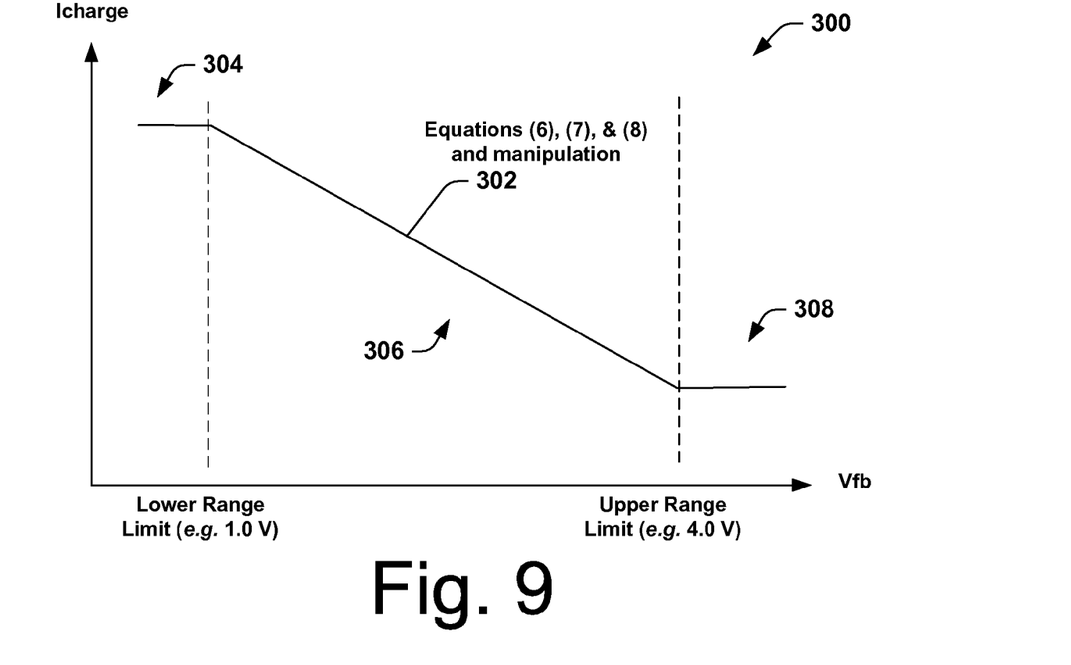
FIG. 9 is a graph of simulation results showing a relationship between $I_{charge}$ and $V_{fb}$ for a composition of the three equations and following mathematical manipulation.

More specifically, FIG. 9 is a graph 300 of simulation results showing a desired waveform 302 of the relationship between charging current $I_{charge}$ versus feedback voltage $V_{fb}$ following mathematical manipulation of selected portions of the waveforms 282, 292, 294 shown in FIG. 8. More specifically, in this implementation, for a first portion 304 of the waveform 302 defined by a feedback voltage $V_{fb}$ less than a lower range limit (e.g. 1.0 V), the desired waveform 302 is achieved by mathematical manipulation of Equation (7). In this implementation, the mathematical manipulation may be performed by a calculation circuit 165 (FIG. 3B), which performs the necessary manipulations of the output currents $I_{output01}$, $I_{output02}$, $I_{output03}$ from the three current multipliers 164, 166, 168, including subtraction and addition operations. Similarly, for a second portion 306 defined by a feedback voltage $V_{fb}$ within the range between the lower range limit and the upper range limit (e.g. 4.0 V), the waveform 302 is derived by mathematical manipulation of Equation (6), while for a third portion 308 defined by a feedback voltage $V_{fb}$ greater than the upper range limit, the waveform 302 is derived by mathematical manipulation of Equation (8). Following mathematical manipulation (e.g. subtraction and addition of $I_{charge\_min}$), the desired waveform 302 (FIG. 9) matching the operating conditions described above with respect to FIG. 4 is achieved. Using different values of the external resistor $R_{ext}$, thereby providing the desired sets of operating conditions (FIG. 4) of the VCO circuit 150.

Implementations in accordance with the teachings of the present disclosure may provide substantial advantages. For example, implementations in accordance with the present disclosure may convert a feedback voltage and a reference voltage into a current signal, and by using at least one current multiplier, may ensure that the feedback voltage exhibits a full working range. Such implementations may also advantageously exhibit temperature and process independence, and may provide an ability to detect overloads. In other implementations, VCO circuits in accordance with the teachings of the present disclosure may be configured to operate using simplified hardware requirements (e.g. fewer pins coupling the inside chip portion with the outside chip portion) in comparison with conventional systems and methods.

It will be appreciated that the VCO circuit 150 described above with respect to FIGS. 1 through 9 is merely an exemplary implementation, and that a variety of alternate implementations may be conceived. For example, alternate implementations may be conceived that use other types of current multipliers, and not merely current multipliers that use current squaring circuits as described above. Furthermore, in other implementations, alternate VCO circuit configurations may be configured to provide operating conditions other than the particular waveforms of charging current $I_{charge}$ versus feedback voltage $V_{fb}$ other than the exemplary waveform configurations described above and shown in the accompanying figures. Also, in further implementations, other electronic devices and components may be conceived that incorporate VCO techniques in accordance with the teachings of the present disclosure including, for example, computers, computer peripherals, counters, timers, calculators, oscilloscopes, wireless electronic equipment, automotive components, aircraft systems, and any other suitable devices and systems.

Exemplary Process

An exemplary process that incorporates a voltage controlled oscillation process in accordance with the present disclosure will now be described. For simplicity, the process will be described with reference to the exemplary environment 100 and the exemplary VCO circuit 150 described above with reference to FIGS. 1 through 9.

Figure 10:
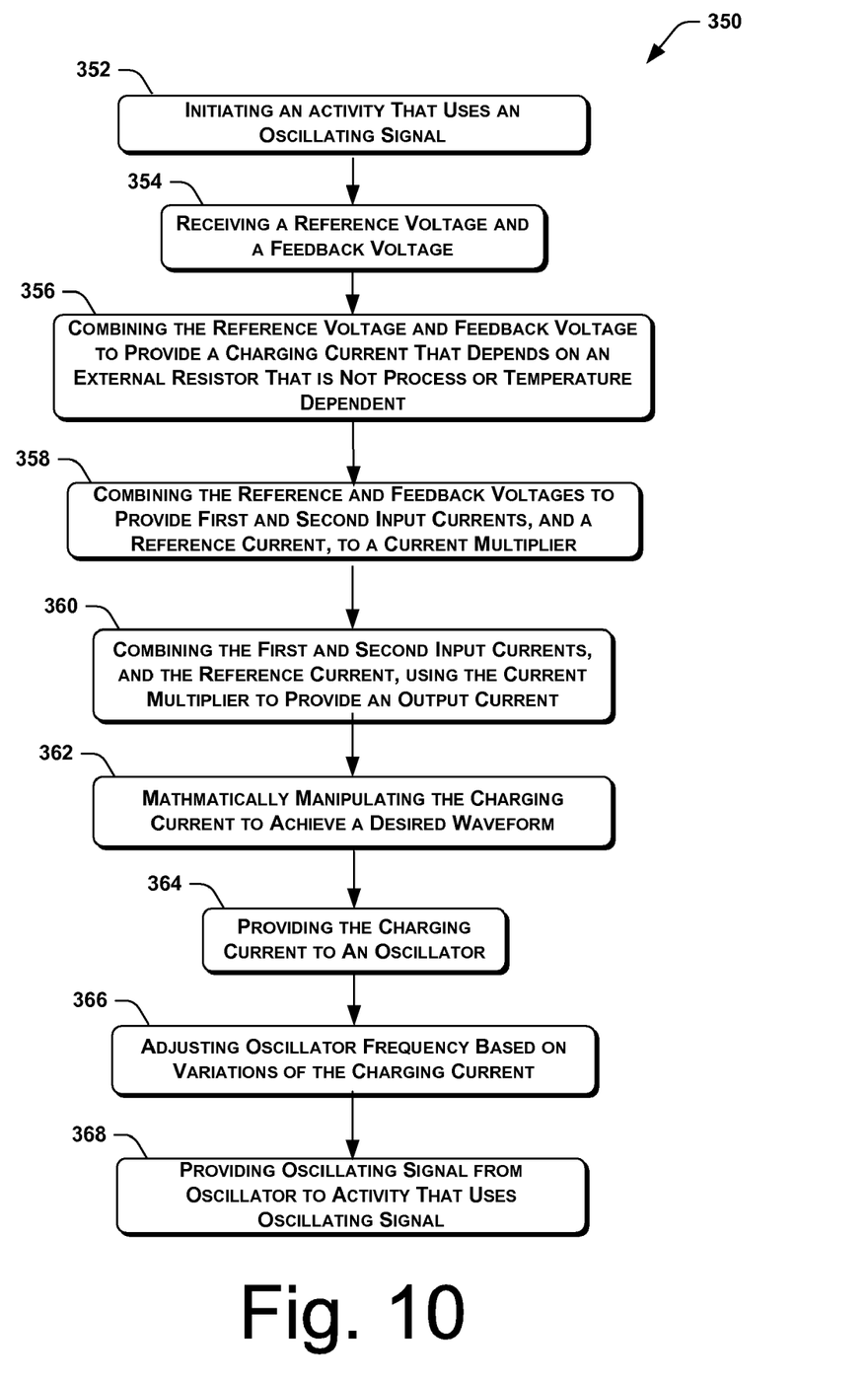
FIG. 10 is a flowchart of a process for providing voltage controlled oscillator signals in accordance with another implementation of the present disclosure.

For example, FIG. 10 is a flowchart of a process 350 for providing voltage controlled oscillator signals in accordance with an implementation of the present disclosure. The process 350 is illustrated as a collection of blocks in a logical flow diagram, which represents a sequence of operations that can be implemented in hardware, software, or a combination thereof. In the context of software, the blocks may represent computer instructions that, when executed by one or more processors, perform the recited operations.

In this implementation, the process 350 includes initiating an activity that uses an oscillating signal at 352. The activity can be any suitable type of activity, including switching operations (e.g. such as those performed in a Switching-Mode Power Supply), providing clock signals, producing waveforms, providing feedback signals, and any other suitable activities. The activity can also be performed as part of the operation of a wide variety of electronic components, including those of computers, computer peripherals, automotive and aircraft components and systems, counters, timers, calculators, oscilloscopes, and wireless electronic equipment, including cellular telephones and other communication devices.

At 354, a reference voltage and a feedback voltage are received, and the reference and feedback voltages are combined to provide a charging current that depends on an external resistor that is not process or temperature dependent at 356. For example, in some implementations, the reference and feedback voltages may be received into a first circuit portion. The first circuit portion may include components (e.g. resistors) that exhibit process or temperature dependence (or both), however, the first circuit portion may be configured such that the process or temperature dependencies are cancelled out, and thus eliminated from the charging current.

The reference and feedback voltages are also combined at 358 to provide first and second input currents, and a reference current, into at least one current multiplier. In some implementations, the voltages are provided to three circuit portions, each circuit portion having a current multiplier. At 360, the first and second input currents and the reference current are combined at the current multiplier to provide an output current. In some implementations, the currents are provided to three current multipliers, each current multiplier providing an output current. In some implementations, each of the one or more current multipliers includes one or more current squaring circuits. In particular implementations, the current multiplier may include first and second current squaring circuits arranged in a four-quadrant current multiplier configuration. The current multiplier may also be configured to provide an output current that provides a full working range of the feedback voltage $V_{fb}$, and not be dependent on process and temperature.

At 362, the output current of each of the one or more current multipliers may be mathematically manipulated to achieve a desired waveform of the charging current. For example, in some implementations, the output current may be manipulated in a calculation circuit by using a first value given by a first equation (e.g. Equation (6)) within a first range, using a second value given by a second equation (e.g. Equation (7)) within a second range, and using a third value given by a third equation (e.g. Equation (8)) within a third range. In addition, in some implementations, the mathematical manipulation may include subtraction and addition calculations to achieve the desired waveform.

As further shown in FIG. 10, the process 350 may further include providing the charging current to an oscillator at 364, and adjusting an oscillator frequency based on variations of the charging current at 366. For example, in some implementations, the oscillator frequency may become high when the charging current increases, and the oscillator frequency may become low when the charging current decreases. At 368, the oscillating signal from the oscillator may be provided to the activity that uses the oscillating signal.

It will be appreciated that the process 350 is one possible implementation of the teachings disclosed herein, and that the present disclosure is not limited to the particular process implementation shown in FIG. 10. For example, in alternate implementations, certain acts need not be performed in the order described, and may be modified, and/or may be omitted entirely, depending on the circumstances. Moreover, in various implementations, the acts described may be implemented by a computer, controller, processor, programmable device, or any other suitable device, and may be based on instructions stored on one or more computer-readable media or otherwise stored or programmed into such devices. In the event that computer-readable media are used, the computer-readable media can be any available media that can be accessed by a device to implement the instructions stored thereon.

As noted above, techniques in accordance with the present disclosure may provide considerable advantages. For example, implementations in accordance with the present disclosure may convert a feedback voltage and a reference voltage into a current signal, and by using at least one current multiplier, may ensure that the feedback voltage exhibits a full working range. Such implementations may also advantageously exhibit temperature and process independence, and may provide an ability to detect overloads. In other implementations, VCO circuits in accordance with the teachings of the present disclosure may be configured to operate using simplified hardware requirements (e.g. fewer pins coupling the inside chip portion with the outside chip portion) in comparison with conventional systems and methods.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. Accordingly, the scope of the invention should not be limited by the disclosure of the specific implementations set forth above. Instead, the invention should be determined entirely by reference to the claims that follow.

I claim:

1. A method, comprising: combining a reference voltage and a feedback voltage to provide a charging current such that the charging current is not process or temperature dependent; varying an oscillator frequency based on a variation of the charging current; combining the reference voltage and the feedback voltage to provide first and second input currents, and a reference current; and combining the first and second input currents, and the reference current, in a current multiplier configured to provide an output current that provides a full working range of the feedback voltage.

2. The method of claim 1, wherein combining the reference voltage and the feedback voltage to provide the charging current comprises combining the reference voltage and the feedback voltage in a circuit portion to provide charging current, the circuit portion including one or more components that exhibit at least one of process or temperature dependency, the circuit portion being configured such that the of process or temperature dependency is cancelled out of the charging current.

3. The method of claim 1, wherein varying an oscillator frequency based on a variation of the charging current comprises providing a high level oscillator frequency when the charging current increases, and providing a low level oscillator frequency when the charging current decreases.

4. The method of claim 1, wherein combining the first and second input currents, and the reference current, in a current multiplier comprises combining the first and second input currents, and the reference current, in a current multiplier having one or more current squaring circuits.

5. The method of claim 4, wherein combining the first and second input currents, and the reference current, in a current multiplier having one or more current squaring circuits comprises combining the first and second input currents, and the reference current, in a current multiplier that includes first and second current squaring circuits arranged in a four-quadrant current multiplier configuration.

6. The method of claim 1, further comprising: manipulating the output current provided by the current multiplier to achieve a desired waveform of the charging current.

7. The method of claim 6, wherein manipulating the output current comprises using a first value given by a first equation within a first range of the feedback voltage, using a second value given by a second equation within a second range of the feedback voltage, and using a third value given by a third equation within a third range of the feedback voltage.

8. The method of claim 6, wherein manipulating the output current comprises mathematically manipulating the output current using at least one of a subtraction operation, an inversion operation, and an addition operation.

9. The method of claim 1, further comprising performing an activity using an oscillating signal provided by the oscillator.

10. The method of claim 9, wherein performing an activity using an oscillating signal provided by the oscillator comprises performing at least one of switching, providing a clock signal, producing a waveform, and providing a feedback signal.

11. A circuit, comprising: a first portion configured to combine a reference voltage and a feedback voltage to provide a charging current such that the charging current is not process or temperature dependent; a second portion configured to vary an oscillator frequency based on a variation of the charging current; a third portion configured to combine the reference voltage and the feedback voltage to provide first and second input currents, and a reference current, and a fourth portion configured to combine the first and second input currents, and the reference current, in a current multiplier to provide an output current that provides a full working range of the feedback voltage.

12. The circuit of claim 11, wherein the first portion includes one or more components that exhibit at least one of process or temperature dependency, the first portion being configured such that the process or temperature dependency is cancelled out of the charging current.

13. The circuit of claim 11, wherein the second portion is configured to provide a high level oscillator frequency when the charging current increases, and provide a low level oscillator frequency when the charging current decreases.

14. The circuit of claim 11, wherein the fourth portion includes a current multiplier having one or more current squaring circuits.

15. The circuit of claim 11, wherein the fourth portion is further configured to manipulate the output current provided by the current multiplier to achieve a desired waveform of the charging current.

16. An electronic device, comprising: a processor; a communication component operatively coupled to the processor and configured to at least one of receive and transmit communication signals; an auxiliary component operatively coupled to at least one of the processor and the communication component, the auxiliary component being configured to use an oscillation signal from an oscillator driven by a charging current; and a control circuit operatively coupled to the oscillator and configured to combine a reference voltage and a feedback voltage to provide the charging current such that the charging current is not process or temperature dependent, the control circuit further configured to combine the reference voltage and the feedback voltage to provide first and second input currents, and a reference current, and to combine the first and second input currents, and the reference current, in a current multiplier to provide an output current that provides a full working range of the feedback voltage.

17. The electronic device of claim 16, wherein the control circuit includes one or more components that exhibit at least one of process or temperature dependency, the control circuit being configured such that the at least one of process or temperature dependency is cancelled out of the charging current.

* * * * *